United States Patent
Shukla et al.

(10) Patent No.: US 7,650,454 B2
(45) Date of Patent: Jan. 19, 2010

(54) ARBITER MODULE PROVIDING LOW METASTABILITY FAILURE PROBABILITY

(75) Inventors: Gaurav Shukla, Hardoi (IN); Piyush Jain, Muzzaffar Nagar (IN)

(73) Assignee: STMicroelectronics Pvt. Ltd., Greater Noida (UP) (IN)

( * ) Notice: Subject to any disclaimer, the term of this patent is extended or adjusted under 35 U.S.C. 154(b) by 97 days.

(21) Appl. No.: 11/925,559

(22) Filed: Oct. 26, 2007

(65) Prior Publication Data

US 2009/0113099 A1    Apr. 30, 2009

(51) Int. Cl.
*G06F 12/00* (2006.01)
(52) U.S. Cl. .................. 710/241; 326/94; 327/199
(58) Field of Classification Search ........... 710/241, 710/243; 326/94, 26, 28; 327/19, 199
See application file for complete search history.

(56) References Cited

U.S. PATENT DOCUMENTS

| | | | | |
|---|---|---|---|---|
| 6,781,418 B1 * | 8/2004 | Reynolds | ...... | 326/94 |
| 6,853,218 B1 * | 2/2005 | Reynolds | ...... | 326/94 |
| 7,383,370 B1 * | 6/2008 | Sancheti et al. | ...... | 710/241 |

* cited by examiner

*Primary Examiner*—Clifford H Knoll
(74) *Attorney, Agent, or Firm*—Hogan & Hartson LLP

(57) ABSTRACT

An arbiter module receives two or more closely occurring asynchronous requests and provides an output with a low metastability failure probability. The arbiter module includes a request resolving module that receives multiple asynchronous requests for providing a final output. The request resolving module includes one or more arbiter stages cascaded with each other and operatively coupled with logic units.

12 Claims, 13 Drawing Sheets

B in region 1 :
Tp = $Tp_{NM}$
o/p = B1

B in region 2 :
Tp = $Tp_M(>Tp_{NM})$
o/p = B1 or A1

B in region 3 :
Tp = $Tp_{NM}$
o/p = A1

ARBITER MODULE PROVIDING LOW METASTABILITY FAILURE PROBABILITY

FIELD OF THE INVENTION

The present invention relates to arbiters used in electronic circuits, and more specifically to an arbiter module capable handling two or more asynchronous requests occurring very closely with a low metastability probability failure.

BACKGROUND OF THE INVENTION

An arbiter is a decision making device that outputs one event out of two or more asynchronous occurring events. In simple case scenario, the arbiter is used when two input events arrive with a sufficient time gap, so it is easy to select an output event out of these incoming input events.

FIG. 1 illustrates a block diagram of a conventional arbiter 102. The conventional arbiter 102 processes two asynchronous requests A and B to provide an output (A1 or B1). The working of the conventional arbiter 102 is explained in the following section.

FIG. 2 illustrates a circuit diagram of the conventional arbiter 102. A MUTual EXclusion (MUTEX) logic can be most commonly used for implementing an arbiter circuit. The arbiter 102 includes a first NAND element 202, a second NAND element 204, a first flag generation inverter 206 and a second flag generation inverter 208. When there is a wide time gap between the occurrences of two asynchronous requests, the arbiter 102 turns on a flag for the first request while keeping the second flag low. But when two requests occur very closely then the arbiter 102 can move into a metastability state and in this case the output of the arbiter 102 will be unpredictable with an unpredictable delay.

When any input A (B) goes high at the first NAND element 202 (204), while the other input B (A) is low, the output (such as A_nand (B_nand)) of the corresponding NAND 202 (204) goes low, thereby causing a flag_A (flag_B) to move high. This in turn blocks any subsequent change happening on the input B (A) from impacting this flag state. This flag state remains intact as long as the input A (B) remains high. Further, the flag generation inverter 206 (208) is powered by the input of the other similar inverter 208 (206) and vice versa, so as to avoid any accidental glitch on the unintended NAND 204 (202) output from being transferred to the respective flag during metastability state as the PMOS will not witness the required gate overdrive voltage.

However, the MUTEX logic of the arbiter 102 can predict metastability problems depending on the occurrence interval of the inputs (A or B). If both the inputs A and B rise very closely or simultaneously, the output from both the NAND elements 202 and 204 starts falling. Eventually the output get resolved in opposite directions depending upon the arrival time difference of the inputs A and B and gain factor of the NAND elements 202 and 204. In this situation, the output flag from the inverters 206 and 208 will be unpredictable and might appear after an unpredictable time.

FIG. 3 illustrates a generalized timing diagram for analyzing a conventional arbitration technique. For a MUTEX logic, region (2) is a region of metastability, i.e., if the inputs A and B both rise within the region (2), then the output of the MUTEX logic will be unpredictable and propagation delay of the MUTEX logic will be more than $Tp_{NM}$ (propagation delay with no metastability) as depicted in FIG. 3. An aperture time (Ta) can be easily defined as occurrence interval of two events in which propagation delay is more than normal propagation delay, i.e., $Tp_{NM}$.

FIG. 4 illustrates another conventional arbitration scheme used in a brute force (waiting) synchronizer 400. The brute force (waiting) synchronizer 400 includes two flip flops 402 and 404. The synchronizer 400 synchronizes an asynchronous input A to a clock Clk. The flip flop 402 samples the input A and gives an output AW. The output AW is sampled by the flip flop 404 and gives the final synchronized signal AS. However, while the input A is being sampled by the flip flop 402, the flip flop 402 may go into a metastability state, depending on the occurrence interval of the input A and the clock Clk. The metastability state may end after a waiting period Tw. Usually the waiting time is one clock cycle, which means that the output of the flip flop 402 is sampled by the flip flop 404 at second Clk rising edge to generate the final synchronized signal AS. In general to implement an N-cycle waiting period, we need N cascaded flip flops in addition to the sampling flip flop 402. Thus the total synchronization latency is N+1 cycles. In this method, if the metastability delay is more than one cycle then a two stage cascaded flip-flop will not ensure correct output. This means that we need to wait for a longer time interval to have a better confidence on output availability.

The conventional arbitration techniques are unable to provide metastability stability when two or more incoming requests occur very closely (or simultaneously). These conventional arbiter techniques provide an unpredictable output with an unpredictable delay during working.

Therefore there is a need of an arbiter module which can overcome metastability stability problems and provide a low metastability failure probability, when two or more asynchronous requests occur very closely.

SUMMARY OF THE INVENTION

It is an object the present invention to provide a high performance arbiter with a low metastability failure probability.

A preferred embodiment of the invention provides an arbiter module for reducing metastability failure probability of a plurality of asynchronous requests (A, B, C . . . n) comprising: a request resolving module providing a final output (FA/FB/ . . . /Fn) selected from the plurality of asynchronous requests (A, B, C . . . n).

Preferably, an embodiment of the present invention provides an arbiter module comprising:

a first arbiter (602) receiving a first request (A) and a second request (B) to generate a first output (A1, B1);

a second arbiter (604) receiving a first delayed request (A') derived from the first request (A) and a second delayed request (B') derived the second request (B) to generate a second output (A2, B2);

at least one logic unit (606 and 608) processing a plurality of combinations of the first output (A1, B1) and the second output (A2, B2) to generate a first processed signal and a second processed signal; and a third arbiter (610) receiving the first processed signal and the second processed signal to generate a final output (FA/FB).

A preferred method of the present invention provides a method for reducing metastability failure probability of a plurality of asynchronous requests (A, B, C . . . n) comprising:

calculating a set of delay values for the plurality of asynchronous requests (A, B, C . . . n) to avoid metastability in a first arbitration stage and to reduce a metastability failure probability in subsequent arbiter stages;

processing the plurality of asynchronous requests (A, B, C . . . n) using delay elements based on the set of delay values to generate a plurality of delayed requests (A',B',C',D' . . . n');

processing a plurality of first outputs (A1, B1, A2, B2, . . . An, Bn) generated from the first arbitration stage using the plurality of asynchronous requests (A,B,C . . . n) and the plurality of delayed request (A', B', C', . . . n') to generate a plurality of processed outputs; and processing the plurality of processed outputs to reduce the metastability failure probability at the subsequent arbiter stages to generate a final output (FA/FB/ . . . /Fn).

A preferred computer program product of the present invention utilizes a preferred method for reducing metastability failure probability of a plurality of asynchronous requests (A, B, C . . . n), the computer program product comprising a computer readable medium configured with processor executable instructions, the computer program product preferably comprising:

calculating a set of delay values for the plurality of asynchronous requests (A, B, C . . . n) to avoid metastability in a first arbitration stage and to reduce a metastability failure probability in subsequent arbiter stages;

processing the plurality of asynchronous requests (A, B, C . . . n) using delay elements based on the set of delay values to generate a plurality of delayed requests (A',B',C',D' . . . n');

processing a plurality of first outputs (A1, B1, A2, B2, . . . An, Bn) generated from the first arbitration stage using the plurality of asynchronous requests (A,B,C . . . n) and the plurality of delayed request (A', B', C', . . . n') to generate a plurality of processed outputs; and processing the plurality of processed outputs to reduce the metastability failure probability at the subsequent arbiter stages to generate a final output (FA/FB/ . . . /Fn).

BRIEF DESCRIPTION OF DRAWINGS

The aforementioned aspects and other features of the present invention will be explained in the following description, taken in conjunction with the accompanying drawings, wherein.

DETAILED DESCRIPTION OF THE INVENTION

Figure 1:
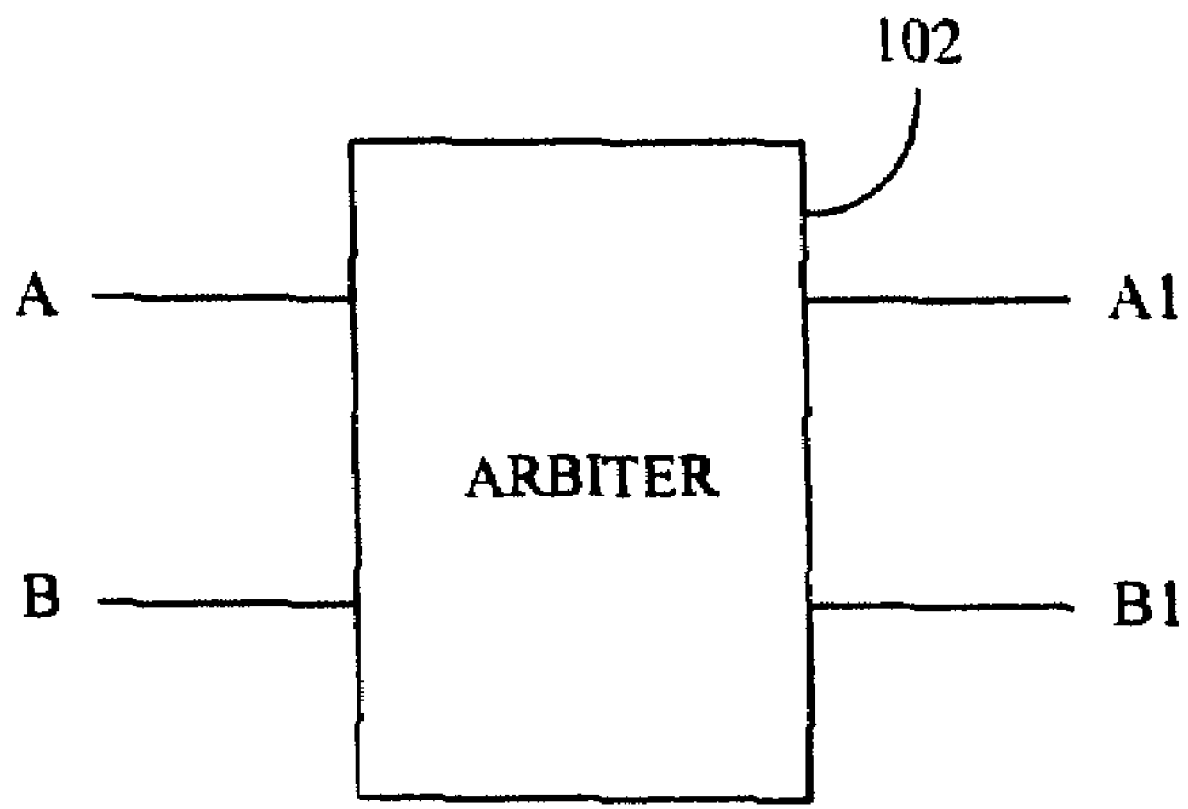
FIG. 1 illustrates a block diagram of a conventional arbiter.
Figure 2:
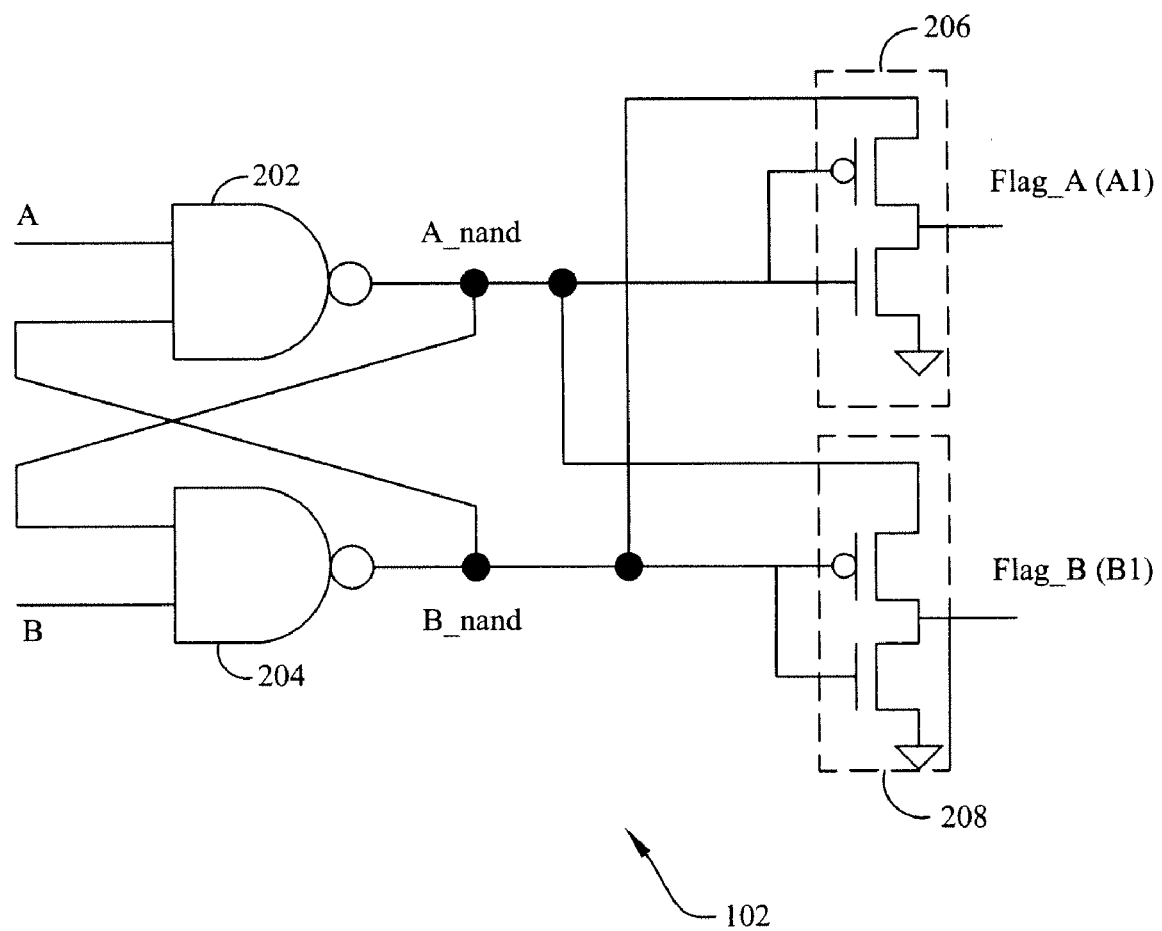
FIG. 2 illustrates an embodiment of the conventional arbiter.
Figure 3:
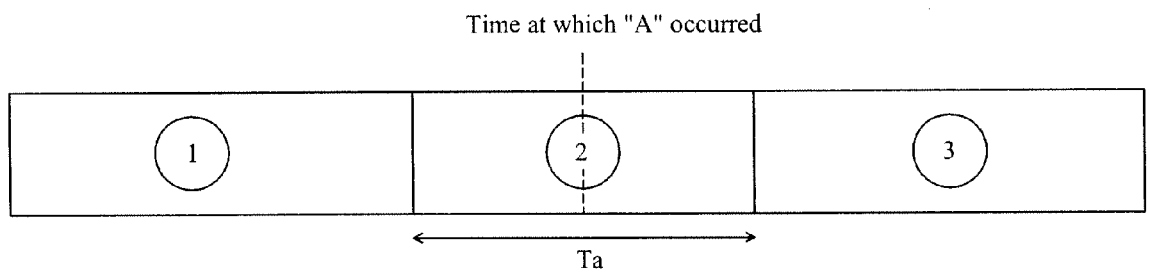
FIG. 3 illustrates a generalized timing diagram for analyzing the conventional arbitration technique.
Figure 4:
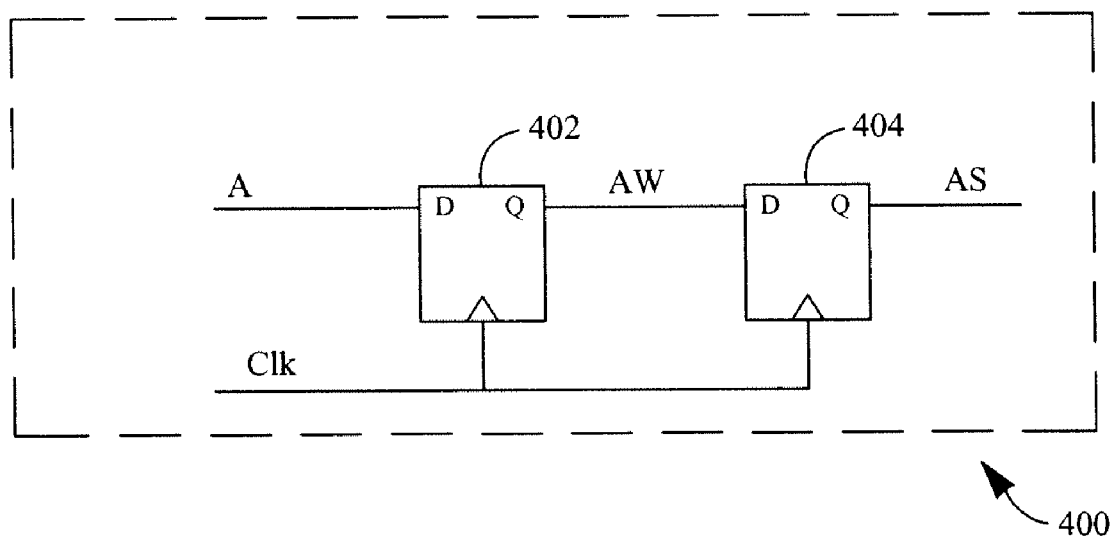
FIG. 4 illustrates a block diagram of another conventional brute force (waiting) synchronizer.
Figure 4:
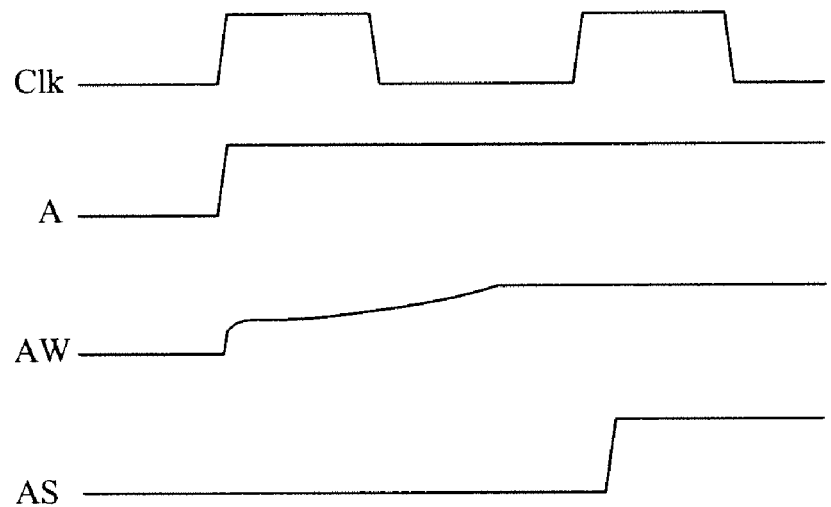

The preferred embodiments of the present invention will be described in detail with reference to the accompanying drawings. However, the present invention is not limited to the preferred embodiments. The present invention can be modified in various forms. The preferred embodiments of the present invention are only provided to explain more clearly the present invention to the ordinarily skilled in the art of the present invention. In the accompanying drawings, like reference numerals are used to indicate like components.

FIG. 1, FIG. 2, FIG. 3 and FIG. 4 are already explained in the above background section.

Figure 5:
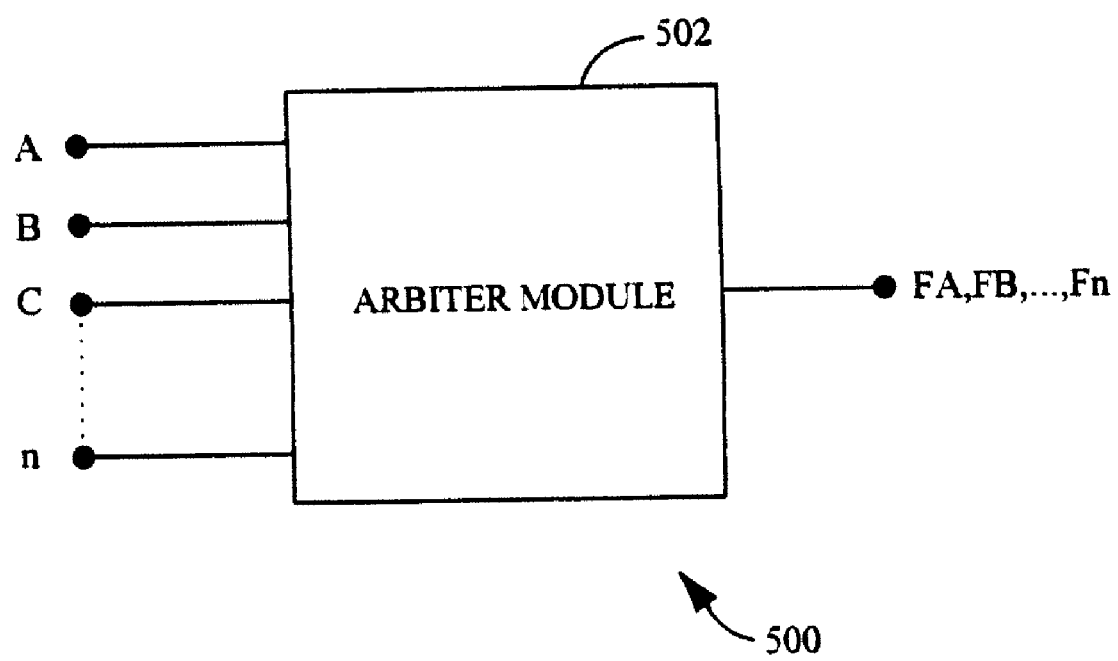
FIG. 5 illustrates a block diagram of an arbiter module according to an embodiment of the present invention.

FIG. 5 illustrates a block diagram of an arbiter module 500 according to an embodiment of the present invention. The arbiter module 500 includes a request resolving module 502. The request resolving module 502 receives multiple asynchronous requests A, B, C . . . n and some or all of these requests can be having close occurrences with each other. The request resolving module 502 provides a final output (FA or FB, or . . . , Fn) with a low metastability failure probability.

Figure 6:
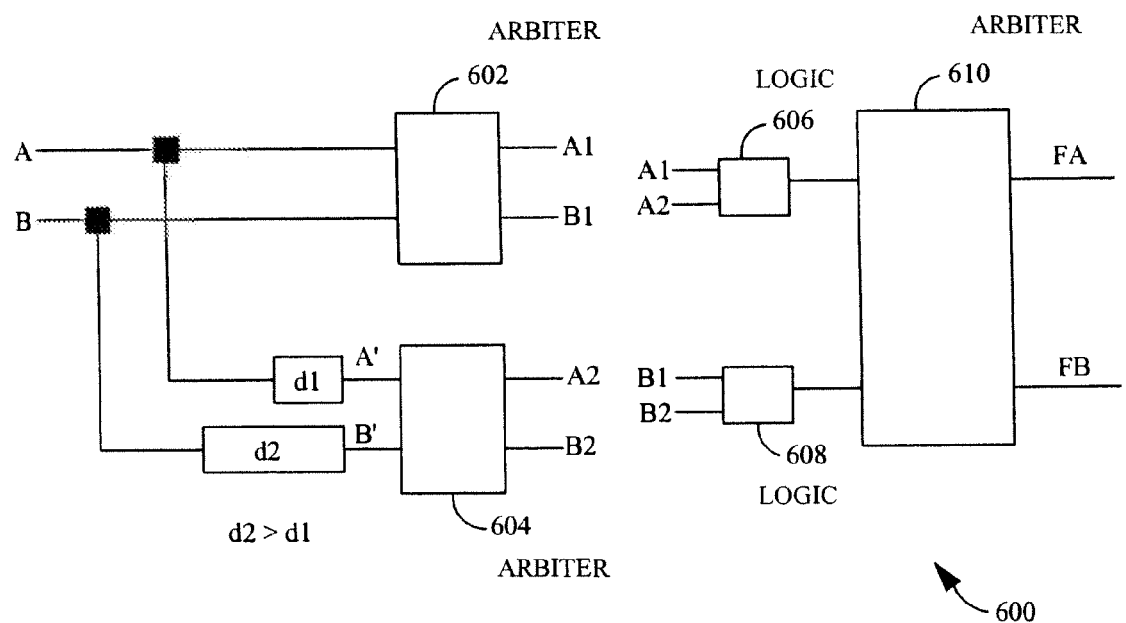
FIG. 6 illustrates a circuit diagram of an arbiter module according to another embodiment of the present invention.

FIG. 6 illustrates a circuit diagram of an arbiter module 600 according to another embodiment of the present invention. The arbiter module 600 includes a first arbiter 602, a second arbiter 604, two logic units 606 and 608 and a third arbiter 610. In an embodiment of the present invention, the logic units 606 and 608 can be OR logic gates.

The first arbiter 602 receives a first request A and a second request B. The second arbiter 604 is operatively coupled in parallel to the first arbiter 602 for receiving a first delayed request A' and a second delayed request B' derived from the first request A and the second request B respectively. The first arbiter 602 generates first outputs (A1, B1) and the second arbiter 604 generates second outputs (A2, B2). The logic units 606 and 608 process the first output and the second output or any combinations thereof to generate a first processed signal and a second processed signal (generated at the outputs of the logic units 606 and 608). The third arbiter 610 is operatively coupled to the first arbiter 602 and the second arbiter 604 through the two logic units 606 and 608. The third arbiter 610 receives the first processed signal and the second processed signal to generate a final output (FA/FB), which will remain asserted until the corresponding input is deselected.

Figure 7:
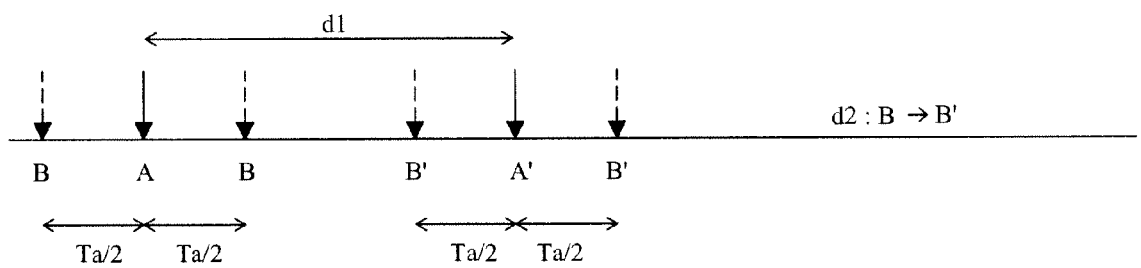
FIG. 7 illustrates a generalized timing diagram for analyzing the arbitration techniques according to an embodiment of the present invention.

FIG. 7 illustrates a generalized timing diagram for analyzing the arbitration techniques according to an embodiment of the present invention. The arbiter module 600 provides a low metastability failure probability by ensuring that the first arbiter 602 and the second arbiter 604 in a first arbitration stage do not simultaneously enter into the metastability and probability of opposite outputs from the first arbiter 602 and the second arbiter 604 (in case of one arbiter entering metastability) falling into an aperture time Ta of the third arbiter 610 is reduced. The arbiter module 600 avoids simultaneous metastability at the first arbiter 602 and the second arbiter 604 so that at least one metastability free output is available from the first arbitration stage. If the first request A and the second request B rise within the aperture time Ta, then the first arbiter 602 will be in the metastability. So the design of delay blocks d1 and d2 should ensure that the second arbiter 604 does not go into metastability, i.e., the first delayed request A' and the second delayed request B' do not rise within the aperture time Ta, which requires that:

$$d2 > Ta/2 + d1 + Ta/2$$

$$d2 < Ta/2 + d1 - Ta/2$$

$$d2 > d1$$

$$d2 < d1 - Ta/2 - Ta/2$$

From these equations it can be deduced that metastability at the first arbitration stage can be avoided if (d2−d1)>Ta [from equations (i) & (iii)] or (d1−d2)>Ta [from equations (ii) & (iv)], i.e., the occurrence interval between the two requests (A, B) should be more than the aperture time Ta in any direction.

If we consider d2>d1 then equations (ii) and (iv) can be discarded and the design criterion will be:

$$d2 - d1 > Ta$$

This condition implies two things that whenever there is metastability expected at the first arbiter 602, then:

There will be no metastability at the second arbiter 604 and vice-versa.

The output of the second arbiter 604 will be A2 only.

Figure 8:
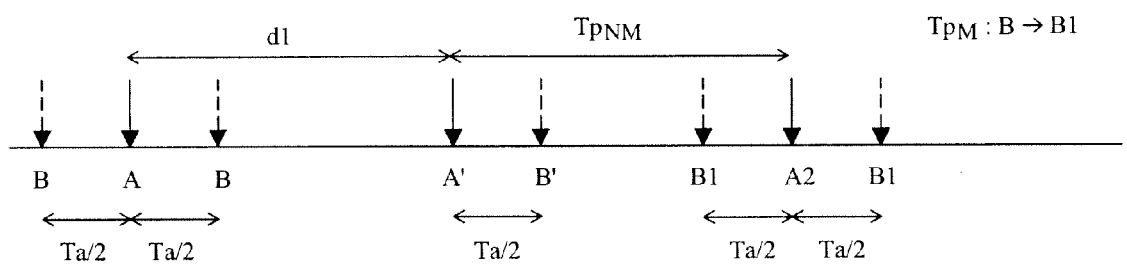
FIG. 8 illustrates another generalized diagram for analyzing the arbitration techniques according to an embodiment of the present invention.

FIG. 8 illustrates another generalized timing diagram for analyzing the arbitration techniques according to another embodiment of the present invention. The instant invention minimizes the possibility of metastability at a second stage. Referring to the FIG. 6, if the first arbiter 602 enters into metastability, then the output from the first arbiter 602 can be A1 or B1 with $Tp=Tp_M$ (>$Tp_{NM}$) while the output from the second arbiter 604 will be A2 only ($Tp_{NM}+d1$) after the first request A is rising.

The Metastability at the second arbitration stage can be avoided if the first output B1 from the first arbiter 602 rises outside the aperture time Ta around the second output A2 rising from the second arbiter 604, which requires:

$$Tp_M > Ta/2 + d1 + Tp_{NM} + Ta/2$$

$$Tp_M < Ta/2 + d1 + Tp_{NM} - Ta/2$$

$$Tp_M > d1 - Ta/2 + Tp_{NM} + Ta/2$$

$$Tp_M < d1 - Ta/2 + Tp_{NM} - Ta/2$$

which means that metastability at the second arbitration stage can be avoided if either of the following two criteria is fulfilled.

$$Tp_M > d1 + Tp_{NM} + Ta$$

$$Tp_M < d1 + Tp_{NM} - Ta$$

Figure 9:
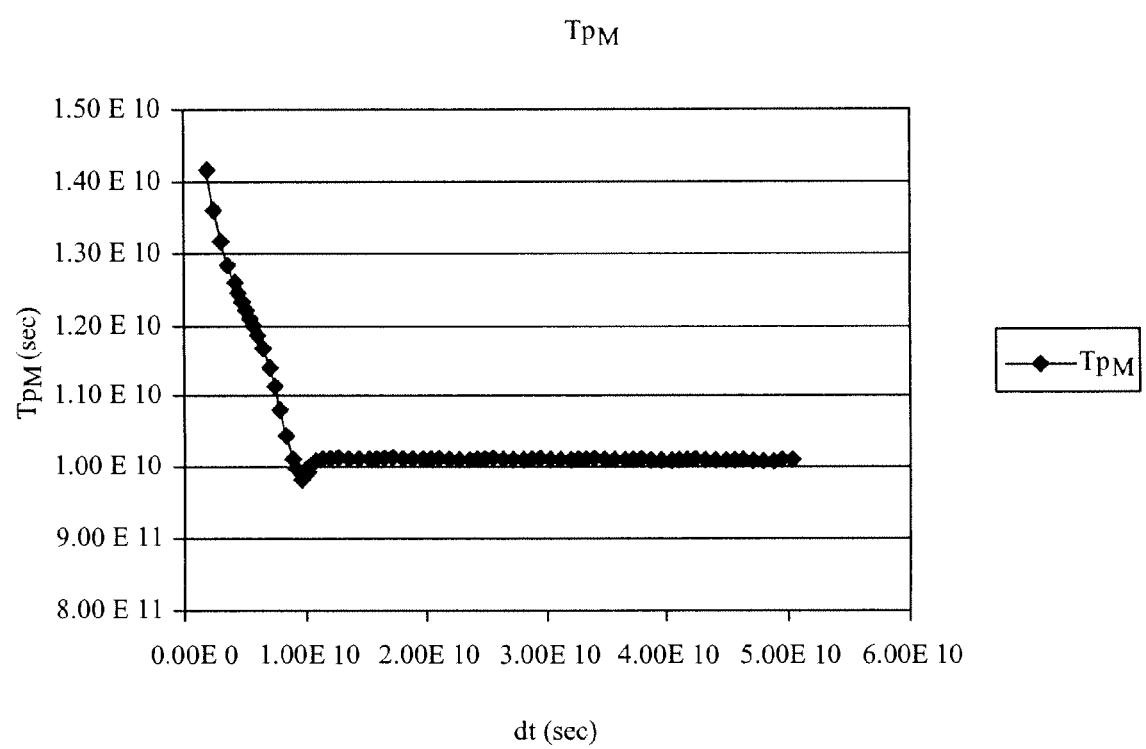
FIG. 9 illustrates a generalized curve for analyzing the arbitration techniques according to an embodiment of the present invention.

When the first request A and the second request B rise almost simultaneously, the initial voltage difference between two NAND outputs and hence the propagation delay of the arbiter module 600 increases exponentially with time. As the initial voltage difference between NAND outputs is proportional to the time difference between the occurrence of two inputs so there is an exponential relationship between the propagation delay of arbiter 600 and the time difference Δt between the arrival of input requests (A and B). One such curve obtained from simulations of a NAND arbiter is illustrated in FIG. 9. It is clear from this curve that a very wide range of $Tp_M$ (on y-axis) corresponds to a very small range of Δt (on x-axis). Thus from equations:

$$Tp_M > d1 + Tp_{NM} + Ta$$

$$Tp_M < d1 + Tp_{NM} - Ta$$

It can be deduced that there is a 2*Ta window around $d1+Tp_{NM}$ within which, if outputs from a first arbiter stage arrive, metastability can occur at the third arbiter 610. To reduce the possibility of the first arbiter stage outputs falling into this time window, the design should target this time window towards the high slope region of the $Tp_M$ vs. Δt curve, i.e., d1 should be tuned so that the range of $Tp_M$ causing metastability at the second stage occurs only for a very small range of Δt. In other words, d1 should be tuned as large as possible.

Thus a very low metastability failure probability can be achieved if:

$$(d2-d1) > Ta$$

d1 is as large as possible.

The following will be mathematically illustrated how the metastability probability is reduced by the instant invention. The probability of metastability failure $P_F$ can be calculated as:

$$P_F(\text{failure}) = P_E * P_S$$

Where $P_E$ is the probability of entering into metastability and $P_S$ is the probability of staying in metastability after a waiting time Tw.

Figure 10:
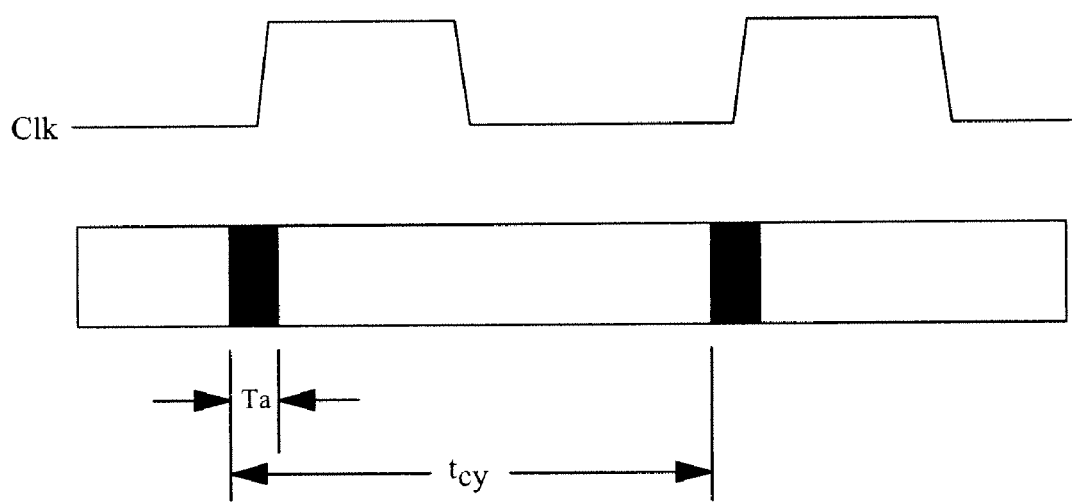
FIG. 10 illustrates a wave diagram showing the aperture time Ta and the clock period tcy according to an embodiment of the present invention.

FIG. 10 illustrates a wave diagram showing the aperture time Ta and the clock period tcy according to an embodiment of the present invention. A flip flop can enter into a metastable state, when a data input D changes the state during an aperture time or a sampling window of the flip flop. The probability of an input transition to occur during the aperture time can be computed by dividing the aperture time Ta by the clock period tcy. Thus probability of entering into the metastability is calculated as:

$$P_E = Ta/tcy = Ta*fcy \text{ (}fcy \text{ represents frequency of input request } A\text{)}$$

Figure 11:
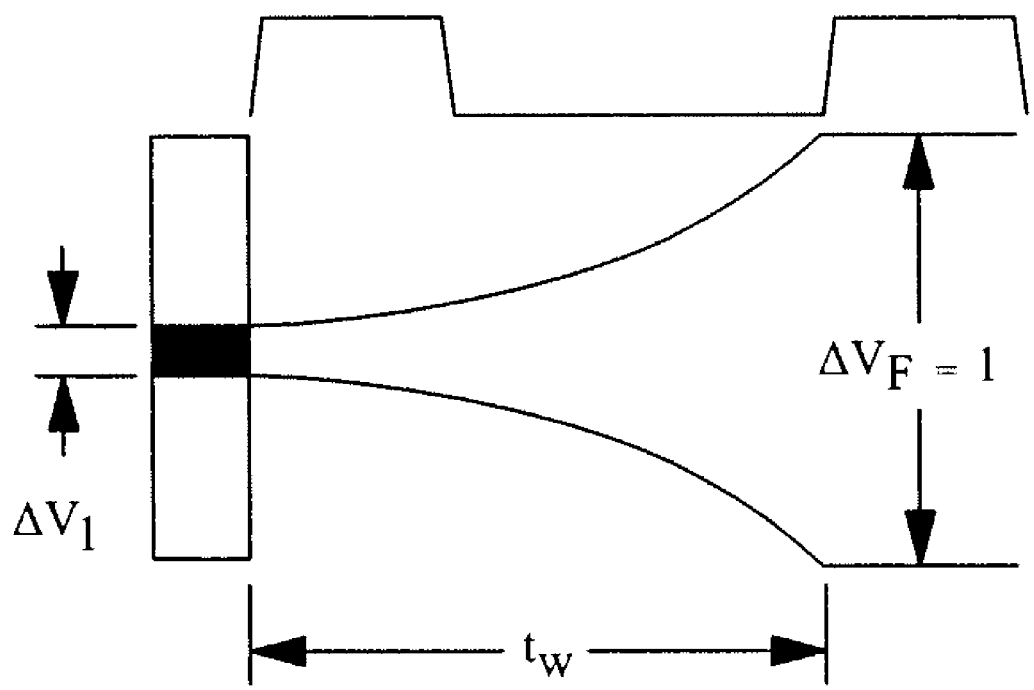
FIG. 11 illustrates a timing diagram according to another embodiment of the present invention.

FIG. 11 illustrates a timing diagram according to another embodiment of the present invention. The arbiter is still in the metastable state after a waiting period Tw, if an initial voltage difference ΔV1 was too small to be exponentially amplified to the full value 1 (normalized with respect to a supply voltage) during the waiting period. Hence final value ΔVF is smaller than 1. The probability of this to happen is defined to be the ratio of the initial difference ΔV1 to the corresponding final value ΔVF. That is:

$$\Delta VF = \Delta V1 * \exp(Tw/\zeta_S)$$

$$P_S = \Delta V1/\Delta Vf = \exp(-Tw/\zeta_S)$$

Where $\zeta_S$ is a resolving time constant of NAND latch (≈C/gm).

In the instant invention, a metastability failure will occur only if a time taken by the first arbiter 602 ($Tp_M$) to resolve is:

$$d1 + Tp_{NM}2 - Ta3 \leq Tp_M1 \leq d1 + Tp_{NM}2 + Ta3$$

So, $P_S$=(Probability of not resolving within $(d1+Tp_{NM}2+Ta3)$)*(1−Probability of not resolving within $(d1+Tp_{NM}2-Ta3)$)

$$= \exp\{-(d1+Tp_{NM}2+Ta3)/\zeta_S\} * (1-\exp\{-(d1+Tp_{NM}2-Ta3)/\zeta_S\})$$

Considering the fact that metastability in the first arbiter 602 can result in the first output A1 or B1 with equal probability, $P_S$ will further reduce to half because the first output A1 from the first arbiter 602 will not cause metastability at the second arbiter stage.

So, $P_S = \frac{1}{2}\{\exp\{-(d1+Tp_{NM}2+Ta3)/\zeta_S\}*(1-\exp\{-(d1+Tp_{NM}2-Ta3)/\zeta_S\})\}$ Therefore, $P_F = P_E * P_S = Ta*fcy*P_S$ Failure frequency will be given by:

$f_F = P_F * f_D = Ta*fcy*P_S*f_D$

Where $f_D$ represents frequency of input request B.
Mean time between failure (MTBF) is given by:

$MTBF = 1/f_F$ $MTFB = 2/[Ta*fcy*f_D*\exp\{-(d1+Tp_{NM}2+Ta3)/\zeta_S\}*(1-\exp\{-(d1+Tp_{NM}2-Ta3)/\zeta_S\})]$ In conventional implementation with $Tw = d1+Tp_{NM}2$, the MTFB would have been $\exp((d1+Tp_{NM}2)/\zeta_S)/(Ta*fcy*f_D)$ So the disclosed approach achieves better MTBF than the conventional approach.

In an alternate embodiment, the instant invention can further be extended for handling n (more than two) asynchronous requests.

Figure 12:
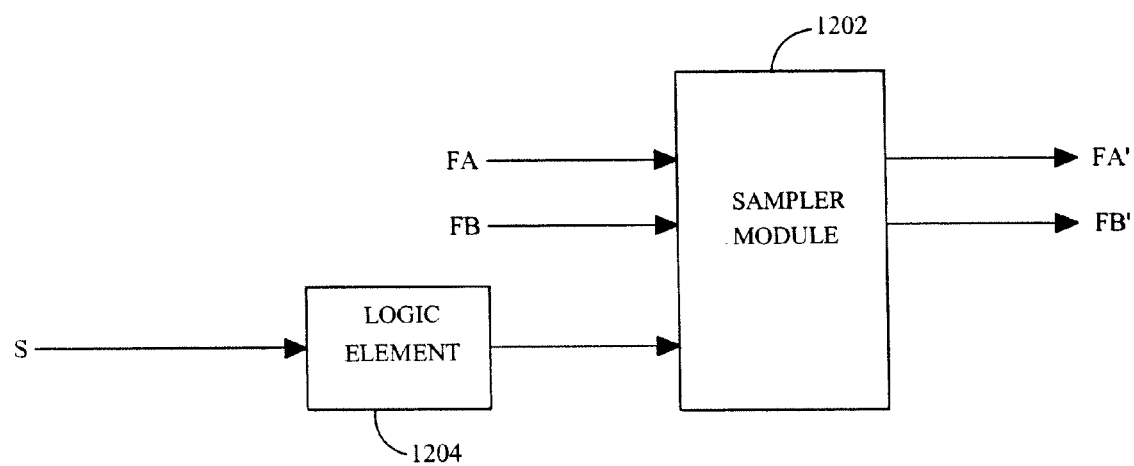
FIG. 12 illustrates a block diagram of a sampler circuit according to an embodiment of the present invention.

In another embodiment the proposed scheme can be further improved by adding a sampler module 1202 and a logic element 1204 as illustrated in FIG. 12. The sampler module 1202 is added at the output of the final stage. The sampler module 1202 is synchronized by a signal S derived from either input asynchronous requests or intermediate arbitration stage signals, where S ∈ [A, B, A1, B1, A2, B2, A', B'].

In yet another embodiment of the present invention, the metastability probability can be further reduced by cascading multiple similar structures in series before a final converging stage.

Figure 13:
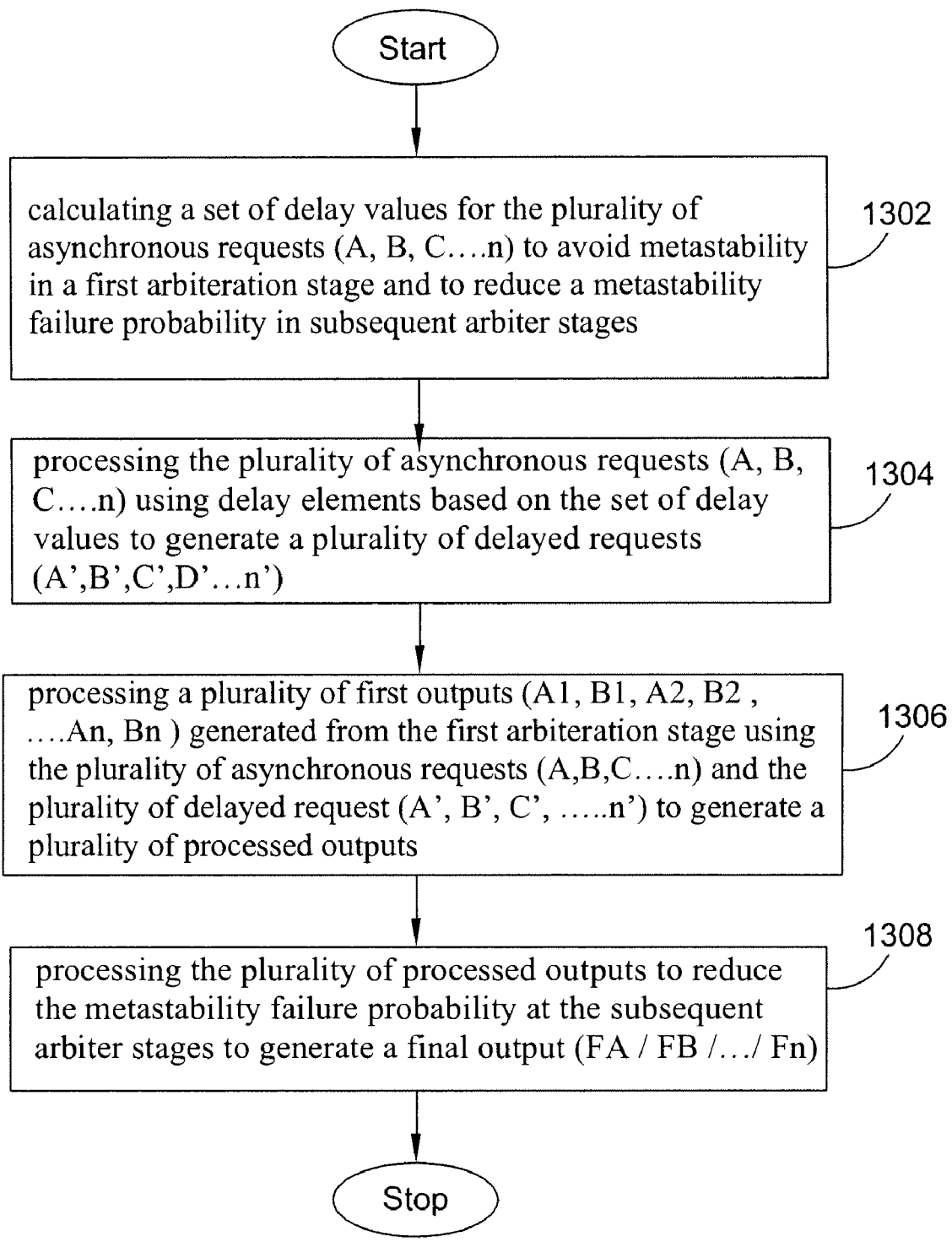
FIG. 13 illustrates a flow diagram of a method for handling a plurality of asynchronous requests according to an embodiment of the present invention.

FIG. 13 illustrates a flow diagram of a method for handling a plurality of asynchronous requests through an arbiter module according to an embodiment of the present invention. At step 1302 a set of delay values is calculated for the plurality of asynchronous requests (A, B, C . . . n) to avoid metastability in a first arbitration stage and to reduce a metastability failure probability in subsequent arbiter stages. At step 1304, the plurality of asynchronous requests (A, B, C . . . n) are processed using delay elements based on the set of delay values to generate a plurality of delayed requests (A',B',C',D' . . . n'). At step 1306, a plurality of first outputs (A1, B1, A2, B2, . . . An, Bn) generated from the first arbitration stage using the plurality of asynchronous requests (A,B,C . . . n) and the plurality of delayed request (A', B', C', . . . n') are processed to generate a plurality of processed outputs. At step 1308, the plurality of processed outputs is processed to reduce the metastability failure probability at the subsequent arbiter stages to generate a final output (FA/FB/ . . . /Fn).

An embodiment of the present invention is related to an arbiter and its embodiment can be used in various applications, such as small as well as large display, different kinds of interrupt handlers used in various processors based applications, and various other applications.

The present invention offers several advantages. Firstly, the present invention provides an arbiter module that can reduce the metastability failure probability significantly. Secondly, the output voltage from the proposed arbiter module will always be a valid logic voltage even in the case of metastability. Thirdly, the proposed implementation can generically be extended to other synchronizer applications.

Although the disclosure of architecture and method has been described in connection with the embodiment of the present invention illustrated in the accompanying drawings, it is not limited thereto. It will be apparent to those skilled in the art that various substitutions, modifications and changes may be made thereto without departing from the scope and spirit of the disclosure.

We claim:

1. An arbiter module for reducing metastability failure probability of a plurality of asynchronous requests comprising:
a request resolving module providing a final output selected from the plurality of asynchronous requests,
wherein a difference between a second delay associated with a second arbiter coupled to the request resolving module and a first delay associated with a first arbiter coupled to the request resolving module is greater than an aperture time associated with the request resolving module.

2. The arbiter module of claim 1, wherein the request resolving module comprises at least one arbiter stage and at least one logic unit.

3. The arbiter module of claim 1 further comprising a sampler module being synchronized by a signal derived from one of the input asynchronous requests and intermediate arbitration stage signals.

4. An arbiter module comprising:
a first arbiter receiving a first request and a second request to generate a first output;
a second arbiter receiving a first delayed request derived from the first request and a second delayed request derived the second request to generate a second output;
at least one logic unit processing a plurality of combinations of the first output and the second output to generate a first processed signal and a second processed signal; and
a third arbiter receiving the first processed signal and the second processed signal to generate a final output,
wherein a difference between a second delay associated with the second delayed request and a first delay associated with the first delayed request is greater than an aperture time of the third arbiter.

5. The arbiter module of claim 4 further comprising a sampler module the sampler module being synchronized by a signal derived from one of the input asynchronous requests and intermediate arbitration stage signals operatively coupled to output terminals of a final arbiter.

6. The arbiter module of claim 4, wherein the at least one logic unit comprises OR logic.

7. A method for reducing metastability failure probability of a plurality of asynchronous requests comprising:
calculating a set of delay values for the plurality of asynchronous requests to avoid metastability in a first arbitration stage and to reduce a metastability failure probability in subsequent arbiter stages, wherein the set of delay values includes a first delay and a second delay, and a difference between the second delay and the first delay is greater than an aperture time associated with at least one of the subsequent arbiter stages;
processing the plurality of asynchronous requests using delay elements based on the set of delay values to generate a plurality of delayed requests;
processing a plurality of first outputs generated from the first arbitration stage using the plurality of asynchronous requests and the plurality of delayed request; and processing the plurality of processed outputs to reduce the metastability failure probability at the subsequent arbiter stages to generate a final output.

8. The method of claim 7, wherein said calculating the set of delay values comprises calculating a failure frequency.

9. The method of claim 7, wherein said processing of the plurality of first outputs comprises performing logic OR operations on the plurality of first outputs.

10. The method of claim 7, wherein said processing the plurality of processed outputs comprises providing the delay to the plurality of processed outputs to further reduce the metastability failure probability.

11. The method of claim 7 further comprising processing a plurality of asynchronous requests and the plurality of delayed requests through the first arbitration stage to generate a plurality of first outputs.

12. A computer program product utilizing a method for reducing metastability failure probability of a plurality of asynchronous requests, the computer program product comprising a computer readable medium configured with processor executable instructions, the computer program product comprising:

calculating a set of delay values for the plurality of asynchronous requests to avoid metastability in a first arbitration stage and to reduce a metastability failure probability in subsequent arbiter stages, wherein the set of delay values includes a first delay and a second delay, and a difference between the second delay and the first delay is greater than an aperture time associated with at least one of the subsequent arbiter stages;

processing the plurality of asynchronous requests using delay elements based on the set of delay values to generate a plurality of delayed requests;

processing a plurality of first outputs generated from the first arbitration stage using the plurality of asynchronous requests and the plurality of delayed request; and processing the plurality of processed outputs to reduce the metastability failure probability at the subsequent arbiter stages to generate a final output.

* * * * *